US008645404B2

(12) United States Patent
Aithal et al.

(10) Patent No.: US 8,645,404 B2
(45) Date of Patent: Feb. 4, 2014

(54) MEMORY PATTERN SEARCHING VIA DISPLACED-READ MEMORY ADDRESSING

(75) Inventors: K. S. Sadananda Aithal, Bangalore (IN); Ajay K. Sami, Ongole (IN)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 13/278,743

(22) Filed: Oct. 21, 2011

(65) Prior Publication Data

US 2013/0103718 A1   Apr. 25, 2013

(51) Int. Cl.
*G06F 17/30* (2006.01)
*G06F 12/00* (2006.01)
*G06F 13/00* (2006.01)

(52) U.S. Cl.
CPC ............... *G06F 17/30* (2013.01); *G06F 12/00* (2013.01); *G06F 13/00* (2013.01)
USPC ........... 707/758; 707/700; 707/736; 707/749; 707/780; 707/812; 711/108; 711/136; 711/137; 711/143; 711/152; 711/159; 711/212

(58) Field of Classification Search
CPC ......... G06F 17/00; G06F 17/30; G06F 12/00; G06F 13/00
USPC .................. 707/705–709, 770–773, 790–793, 707/796–797, 813–814, 699–700, 736, 749, 707/758, 780, 812; 711/100–101, 126–130, 711/133, 152–153, 158, 173, 205–207, 209, 711/217–221, 117–120, 122, 136–137, 711/142–143, 159–160, 212
See application file for complete search history.

(56) References Cited

U.S. PATENT DOCUMENTS 3,742,460 A * 6/1973 Englund ................................ 1/1
3,997,882 A * 12/1976 Goyal .......................... 365/49.1

(Continued)

FOREIGN PATENT DOCUMENTS

| WO | WO 95/16961   | * | 6/1995 |
| WO | WO 99/35579   | * | 7/1999 |
| WO | WO 2009/021835 | * | 2/2009 |

OTHER PUBLICATIONS

Chee-Fen Yu et al. Efficient Branch-and-Bound Algorithms on a Two-Level Memory System, IEEE Transactions on Software Engineering, vol. 14. No. 9, Sep. 1988, pp. 1342-1356.*

(Continued)

*Primary Examiner* — Srirama Channavajjala
(74) *Attorney, Agent, or Firm* — Lee Law, PLLC; Christopher B. Lee

(57) ABSTRACT

A split data word including a portion of each of two word-aligned data words stored at two word-aligned address boundaries within a memory is read from a displaced-read memory address relative to the word-aligned address boundaries within the memory. The portions of each of the two word-aligned data words within the split data word are compared with corresponding portions of a word-aligned search pattern. A determination is made that a potential complete match for the word-aligned search pattern exists within at least one of the two word-aligned data words based upon an identified match of at least one of the portions of the two word-aligned data words within the split data word with a corresponding at least one portion of the word-aligned search pattern.

15 Claims, 7 Drawing Sheets

(56) References Cited

U.S. PATENT DOCUMENTS

| | | | | |
|---|---|---|---|---|
| 4,916,655 | A * | 4/1990 | Ohsone et al. | 1/1 |
| 5,107,454 | A * | 4/1992 | Niki | 706/25 |
| 5,388,234 | A * | 2/1995 | Kanno et al. | 711/220 |
| 5,393,927 | A * | 2/1995 | Aoki | 84/631 |
| 5,787,395 | A * | 7/1998 | Minamino | 704/255 |
| 6,023,536 | A * | 2/2000 | Visser | 382/310 |
| 6,163,834 | A * | 12/2000 | Garcia et al. | 711/206 |
| 6,430,072 | B1 * | 8/2002 | Chadwick et al. | 365/49.15 |
| 6,507,678 | B2 * | 1/2003 | Yahagi | 382/305 |
| 6,862,655 | B1 * | 3/2005 | Podaima et al. | 711/108 |
| 7,257,671 | B2 * | 8/2007 | Kanazawa | 711/108 |
| 7,711,719 | B1 | 5/2010 | Waldin et al. | |
| 7,877,401 | B1 | 1/2011 | Hostetter et al. | |
| 7,983,480 | B2 * | 7/2011 | Lu et al. | 382/166 |
| 2003/0016748 | A1 * | 1/2003 | Hwang et al. | 375/240.12 |
| 2005/0013179 | A1 * | 1/2005 | Kanazawa | 365/199 |
| 2005/0132244 | A1 | 6/2005 | Milway | |
| 2006/0187737 | A1 * | 8/2006 | Futatsuyama | 365/230.03 |
| 2006/0193159 | A1 * | 8/2006 | Tan et al. | 365/49 |
| 2007/0186050 | A1 * | 8/2007 | Luick | 711/137 |
| 2008/0250232 | A1 * | 10/2008 | Nakashima | 712/225 |
| 2009/0323383 | A1 * | 12/2009 | Mondaeev et al. | 365/49.17 |
| 2010/0128524 | A1 * | 5/2010 | Hadas et al. | 365/185.03 |

OTHER PUBLICATIONS

Ishadutta Yadav et al. "An Efficient Bit-Parallel Multi-Patterns Word Searching Algorithm through Splitting the Text", International Conference on Advances in Recent Technologies in Communication and Computing, 2009, pp. 406-410.*

Ishadutta Yadav et al., "An Efficient Bit-Parallel Multi-Patterns Word Searching Algorithm through splitting the text", International Conference on Advances in Recent Technologies in Communication and Computing, 2009, pp. 406-410.*

Henry G. Baker, The Efficient Implementation of Common Lisp's SEARCH Function on Bit-vectors, Article, Aug. 1989, pp. 1-7, Nimble Computer Corporation, Encino, CA, USA.

Author Unknown, Boyer-Moore String Search Algorithm, Webpage/article: Wikipedia, the free encyclopedia, Jul. 2, 2011, pp. 1-8, Wikimedia Foundation, Inc., Published on the World Wide Web at: http://en.wikipedia.org/wiki/Boyer%E2%80%93Moore_string_search_algorithm.

Maxime Corchemore, et al., Two-Way String-Matching, Journal of the Association for Computing Machinery, Jul. 1991, pp. 651-675, vol. 38, No. 3, ACM, New York, NY, USA.

Paolo Ferragina, et al., The String B-Tree: A New Data Structure for String Search in External Memory and its Applications, Journal of the Association for Computing Machinery, Mar. 1999, pp. 236-280 (plus 1 added citation page), vol. 46, No. 2, ACM, New York, NY, USA.

Markus Geimer, et al., The SCALASCA Performance Toolset Architecture, Journal of Concurrency and Computation: Practice & Experience—Scalable Tools for High-End Computing, Apr. 2010, pp. 702-719 (plus 1 added citation page), vol. 22, No. 6, John Wiley and Sons, Ltd., Chichester, UK.

Sun Wu, et al., A Fast Algorithm for Multi-Pattern Searching, Technical Report, May 1994, pp. 1-11, University of Arizona, Tucson, AZ, USA.

* cited by examiner

MEMORY PATTERN SEARCHING VIA DISPLACED-READ MEMORY ADDRESSING

BACKGROUND

The present invention relates to pattern searching within memory devices. More particularly, the present invention relates to memory pattern searching via displaced-read memory addressing.

Memory devices are organized and addressed via a set of address lines called an address bus. A separate set of data lines called a data bus accesses data contents at addresses specified via the address bus. The numeral two (2) raised to a power representing the number of address lines of the address bus indicates an amount of potentially addressable memory that may be accessed by the address bus.

BRIEF SUMMARY

A method includes reading, from a displaced-read memory address relative to word-aligned address boundaries within a memory, a split data word comprising a portion of each of two word-aligned data words stored at two of the word-aligned address boundaries within the memory; comparing the portions of each of the two word-aligned data words within the split data word with corresponding portions of a word-aligned search pattern; and determining that a potential complete match for the word-aligned search pattern exists within at least one of the two word-aligned data words based upon an identified match of at least one of the portions of the two word-aligned data words within the split data word with a corresponding at least one portion of the word-aligned search pattern.

A system includes a memory and a processor programmed to read, from a displaced-read memory address relative to word-aligned address boundaries within the memory, a split data word comprising a portion of each of two word-aligned data words stored at two of the word-aligned address boundaries within the memory; compare the portions of each of the two word-aligned data words within the split data word with corresponding portions of a word-aligned search pattern; and determine that a potential complete match for the word-aligned search pattern exists within at least one of the two word-aligned data words based upon an identified match of at least one of the portions of the two word-aligned data words within the split data word with a corresponding at least one portion of the word-aligned search pattern.

A computer program product includes a computer readable storage medium including computer readable program code, where the computer readable program code when executed on a computer causes the computer to read, from a displaced-read memory address relative to word-aligned address boundaries within a memory, a split data word comprising a portion of each of two word-aligned data words stored at two of the word-aligned address boundaries within the memory; compare the portions of each of the two word-aligned data words within the split data word with corresponding portions of a word-aligned search pattern; and determine that a potential complete match for the word-aligned search pattern exists within at least one of the two word-aligned data words based upon an identified match of at least one of the portions of the two word-aligned data words within the split data word with a corresponding at least one portion of the word-aligned search pattern.

DETAILED DESCRIPTION

Figure 1:
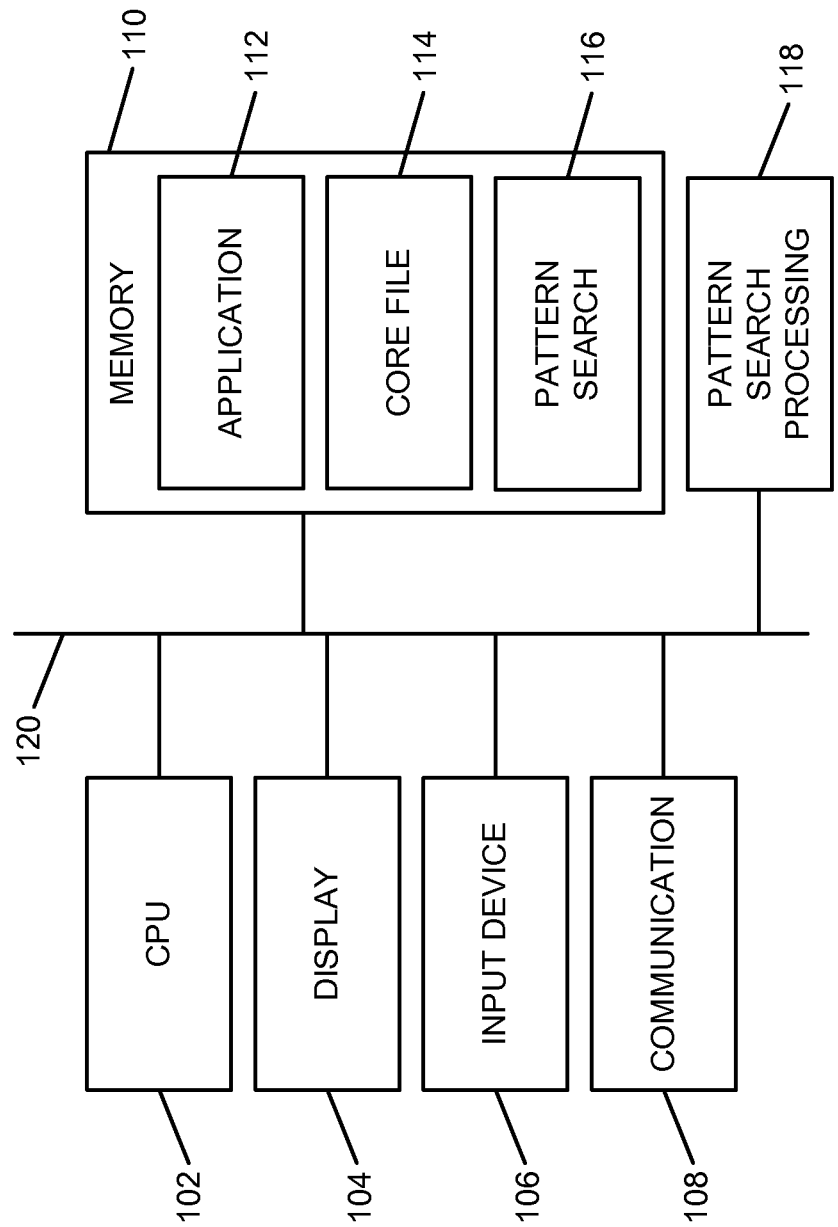
FIG. 1 is a block diagram of an example of an implementation of a computing device for automated/computer-implemented memory pattern searching via displaced-read memory addressing according to an embodiment of the present subject matter.

The examples set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The subject matter described herein provides memory pattern searching via displaced-read memory addressing. The present subject matter improves pattern searching (e.g., within a memory, core file, etc.) by performing a displaced read of memory ("displaced-read memory addressing"). Displaced-read memory addressing, as described herein, involves reading a word width of raw memory (e.g., from a core file or other memory configuration) at an address other than at a word boundary (e.g., halfway between word boundaries) to capture data from two consecutive word addresses with each read operation. A two-level pattern search is implemented. For the first-level pattern search, a full word-aligned search pattern is split into two half words such that half of the two words of memory read via the displaced-read memory address for each first-level search are compared with the corresponding portions of the full word-aligned search pattern. The first level search increments the displaced-read address by two words for each consecutive read operation to ensure that portions of two new words of memory are read during each successive iteration of the first-level processing. In response to a match of either half word during any first-level comparison, a second-level search is performed by issuing a second word-boundary read at an actual word-boundary associated with the matching half of the full word-aligned search pattern. The full word-aligned search pattern is compared to the word-aligned data read from the word boundary to determine whether a word-boundary match has been identified.

For example, for the first-level search, an upper half word from the read pattern is compared against the lower half word of a word-boundary search pattern and the lower half word of the read pattern is compared against the upper half word of the word-boundary search pattern. This methodology of divide-and-compare of two half words from two consecutive memory addresses during the first level of the search operation effectively performs two search iterations/operations in response to one raw memory read operation. Depending upon the memory contents, the overhead associated with the full second level word-boundary comparison may be considerably lower than the overhead associated with conventional linear word-by-word pattern searches. The second level of the search operates to confirm an exact match of an entire word at the word boundary.

It should be noted that, depending upon the particular memory configuration (e.g., Big Endian, Little Endian, etc.), the organization of memory may be different. For a Big Endian memory configuration, reading of raw memory is performed at a boundary between word boundaries, and a data word width that is read from such an address may capture a lower half word from the address that falls on the current word boundary and an upper half word from the address successive to the current word-boundary address. For a Little Endian memory configuration, the data word that is read may be swapped and capture an upper half word from the address that falls on the current word boundary and a lower half word from the address successive to the current word-boundary address. In either implementation, half of two data words from two word locations may be captured with a single read operation and the initial search comparison may be performed against the two data words using the half-word comparison, as described above and in more detail below. It is understood that many different possibilities for memory organization are possible and all such memory organizations are considered within the scope of the present subject matter. As such, the particular arrangement of partial word reads may be modified as appropriate for the given implementation.

The memory pattern searching via displaced-read memory addressing described herein improves the performance of pattern searching by reducing instructions such as increment, search address range boundary check validation, and jump to the start of loop block. The overhead involved by performing the second level comparison for full search pattern at individual word-boundary locations after finding a match of half word may be considerably less than linear word-by-word searching because a half-word search will filter out a majority of the possible matches for word-boundary comparisons and, as such, the execution of second level of comparison may be greatly reduced and may be considered negligible when compared to the filtering performed by embedding two search iterations into a single iteration.

It should be noted that conception of the present subject matter resulted from recognition of certain limitations associated with conventional memory pattern searching. For example, for postmortem debugging, process memory from a core file (process state) is searched for certain patterns. It was observed that conventional pattern searching in process memory in such huge core files is performed in a linear word-by-word manner at word address boundaries. Scanning of memory in such a linear word-by-word manner for a pattern in very large core files was observed to be expensive in terms of turnaround times for debugging results because a scan had to be performed through each addressable location of process memory and the contents read from each addressable location had to be compared with the search pattern. Searching for patterns in process memory in such huge core files may take many minutes and may extend to hours if performed in this linear word-by-word fashion. It was observed that as technological advancements increase memory addressability, real-time applications may also scale enormously in terms of memory consumption, and scanning of such huge memory footprints may suffer from increased time requirements for such pattern searches. The present subject matter improves memory pattern searching by providing a technique for pattern searching that may reduce search times by an order of approximately one half of the time required by linear word-by-word searching, as described above and in more detail below. As such, improved memory pattern searching may be obtained through the memory pattern searching via displaced-read memory addressing described herein.

The memory pattern searching via displaced-read memory addressing described herein may be performed in real time to allow prompt memory searching. For purposes of the present description, real time shall include any time frame of sufficiently short duration as to provide reasonable response time for information processing acceptable to a user of the subject matter described. Additionally, the term "real time" shall include what is commonly termed "near real time"—generally meaning any time frame of sufficiently short duration as to provide reasonable response time for on-demand information processing acceptable to a user of the subject matter described (e.g., within a portion of a second or within a few seconds). These terms, while difficult to precisely define are well understood by those skilled in the art.

FIG. 1 is a block diagram of an example of an implementation of a computing device 100 for automated/computer-implemented memory pattern searching via displaced-read memory addressing. A computing device 100 may be any computing device and may communicate via a network with one or more servers (not shown) as appropriate for the given implementation.

It should be noted that the computing device 100 may be a portable computing device, either by a user's ability to move the computing device 100 to different locations, or by the computing device 100's association with a portable platform, such as a plane, train, automobile, or other moving vehicle. It should also be noted that the computing device 100 may be any computing device capable of processing information as described above and in more detail below. For example, the computing device 100 may include devices such as a personal computer (e.g., desktop, laptop, etc.) or a handheld device (e.g., cellular telephone, personal digital assistant (PDA), email device, music recording or playback device, etc.), or any other device capable of processing information as described in more detail below.

A central processing unit (CPU) 102 provides computer instruction execution, computation, and other capabilities within the computing device 100. A display 104 provides visual information to a user of the computing device 100 and an input device 106 provides input capabilities for the user.

The display 104 may include any display device, such as a cathode ray tube (CRT), liquid crystal display (LCD), light emitting diode (LED), electronic ink displays, projection, touchscreen, or other display element or panel. The input device 106 may include a computer keyboard, a keypad, a mouse, a pen, a joystick, or any other type of input device by which the user may interact with and respond to information on the display 104.

A communication module 108 provides interconnection capabilities that allow the computing device 100 to communicate with other modules within a system, such as the one or more servers described above. The communication module 108 may include any electrical, protocol, and protocol conversion capabilities useable to provide the interconnection capabilities. Though the communication module 108 is illustrated as a component-level module for ease of illustration and description purposes, it should be noted that the communication module 108 may include any hardware, programmed processor(s), and memory used to carry out the functions of the communication module 108 as described above and in more detail below. For example, the communication module 108 may include additional controller circuitry in the form of application specific integrated circuits (ASICs), processors, antennas, and/or discrete integrated circuits and components for performing communication and electrical control activities associated with the communication module 108. Additionally, the communication module 108 may include interrupt-level, stack-level, and application-level modules as appropriate. Furthermore, the communication module 108 may include any memory components used for storage, execution, and data processing for performing processing activities associated with the communication module 108. The communication module 108 may also form a portion of other circuitry described without departure from the scope of the present subject matter.

A memory 110 includes an application area 112 that stores and executes one or more applications. A core file storage area 114 stores one or more core files that may be generated by one or more applications within the application area 112 within the present example for processing, by the computing device 100.

A pattern search storage area 116 provides a memory location for storage and processing of memory pattern searches and other information associated with performing memory pattern searching via displaced-read memory addressing. It should be noted that while the present examples consider processing of core files, any form of memory may be processed using the techniques described herein without departure from the scope of the present subject matter.

It is understood that the memory 110 may include any combination of volatile and non-volatile memory suitable for the intended purpose, distributed or localized as appropriate, and may include other memory segments not illustrated within the present example for ease of illustration purposes. For example, the memory 110 may include an additional code storage area, an operating system storage area, an additional code execution area, and a data area without departure from the scope of the present subject matter.

A pattern search processing module 118 is also illustrated. The pattern search processing module 118 provides processing capabilities for reading and comparing memory read values for the computing device 100, as described above and in more detail below. The pattern search processing module 118 implements the automated memory pattern searching via displaced-read memory addressing of the computing device 100.

Though the pattern search processing module 118 is illustrated as a component-level module for ease of illustration and description purposes, it should be noted that the pattern search processing module 118 may include any hardware, programmed processor(s), and memory used to carry out the functions of this module as described above and in more detail below. For example, the pattern search processing module 118 may include additional controller circuitry in the form of application specific integrated circuits (ASICs), processors, and/or discrete integrated circuits and components for performing communication and electrical control activities associated with the respective devices. Additionally, the pattern search processing module 118 may include interrupt-level, stack-level, and application-level modules as appropriate. Furthermore, the pattern search processing module 118 may include any memory components used for storage, execution, and data processing for performing processing activities associated with the module.

It should also be noted that the pattern search processing module 118 may form a portion of other circuitry described without departure from the scope of the present subject matter. Further, the pattern search processing module 118 may alternatively be implemented as an application stored within the memory 110. In such an implementation, the pattern search processing module 118 may include instructions executed by the CPU 102 for performing the functionality described herein. The CPU 102 may execute these instructions to provide the processing capabilities described above and in more detail below for the computing device 100. The pattern search processing module 118 may form a portion of an interrupt service routine (ISR), a portion of an operating system, a portion of a browser application, or a portion of a separate application without departure from the scope of the present subject matter.

The CPU 102, the display 104, the input device 106, the communication module 108, the memory 110, and the pattern search processing module 118 are interconnected via an interconnection 120. The interconnection 120 may include a system bus, a network, or any other interconnection capable of providing the respective components with suitable interconnection for the respective purpose.

While the computing device 100 is illustrated with and has certain components described, other modules and components may be associated with the computing device 100 without departure from the scope of the present subject matter. Additionally, it should be noted that, while the computing device 100 is described as a single device for ease of illustration purposes, the components within the computing device 100 may be co-located or distributed and interconnected via a network without departure from the scope of the present subject matter. For a distributed arrangement, the display 104 and the input device 106 may be located at a kiosk or other location, while the CPU 102 and memory 110 may be located at a local or remote server. Many other possible arrangements for components of the computing device 100 are possible and all are considered within the scope of the present subject matter. Accordingly, the computing device 100 may take many forms and may be associated with many platforms.

The following FIG. 2 through FIG. 4B assume Big Endian encoding of areas of the memory 110, such that the first data byte/word encoded at a memory address is the highest order byte or word, and the last byte/word encoded at a memory address is the lowest order byte or word. It is further understood that it is possible to represent hexadecimal values (e.g., either address values or data values) with a leading zero followed by a lowercase letter "x" (e.g., "0x"). This representation of hexadecimal values is used for addresses within the following examples, but not for content of memory for ease of description purposes. As such, raw memory values are described, though it is noted that the data values are considered to be hexadecimal in format for purposes of the present examples. It is understood that the following examples may be modified for other encodings based upon the description herein, and all such examples are considered within the scope of the present subject matter.

Figure 2:
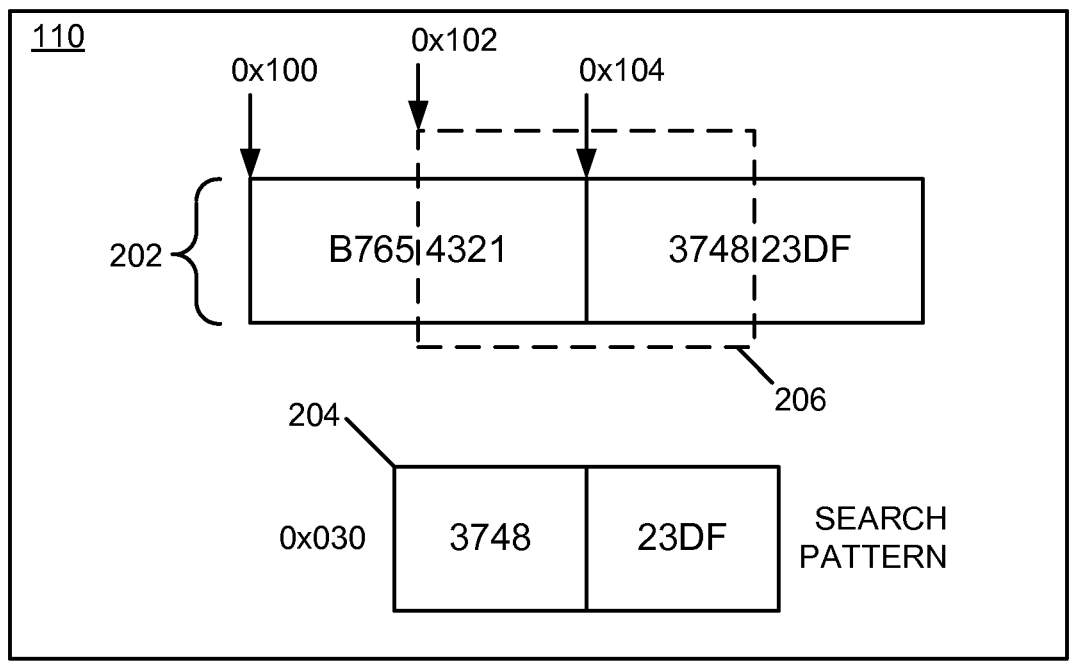
FIG. 2 is a diagram of an example of an implementation of a portion of the memory of FIG. 1 that illustrates a displaced-read operation that may be used in association with automated memory pattern searching via displaced-read memory addressing according to an embodiment of the present subject matter.

FIG. 2 is a diagram of an example of an implementation of a portion of the memory 110 of FIG. 1 that illustrates a displaced-read operation that may be used in association with automated memory pattern searching via displaced-read memory addressing. Within FIG. 2, two words of memory are illustrated within a row 202 at addresses 0x100 and 0x104, respectively. The two words of memory store hexadecimal content "B7654321" and "374823DF," respectively. A search pattern 204 is also defined within a memory location identified within the present example at address 0x030 within the memory 110. The memory location at address 0x030 may, for example, include a register that forms a portion of the pattern search storage area 116. The search pattern 204 stores hexadecimal content "374823DF."

As can be seen from FIG. 2, the content of the search pattern 204 matches the content of the word at address 0x104. As such, a match may be identified within the memory 110, as described in more detail below, at the address 0x104. A displaced-read region 206 identified via a dashed-line rectangle represents a single read operation from the memory 110 at a displaced address 0x102 relative to the word boundaries at addresses 0x100 and 0x104. As such, the displaced-read region 206 identifies a read operation of a portion of each of the data words stored at addresses 0x100 and 0x104, as illustrated by the dashed rectangle representation of the displaced-read region 206.

Figure 3:
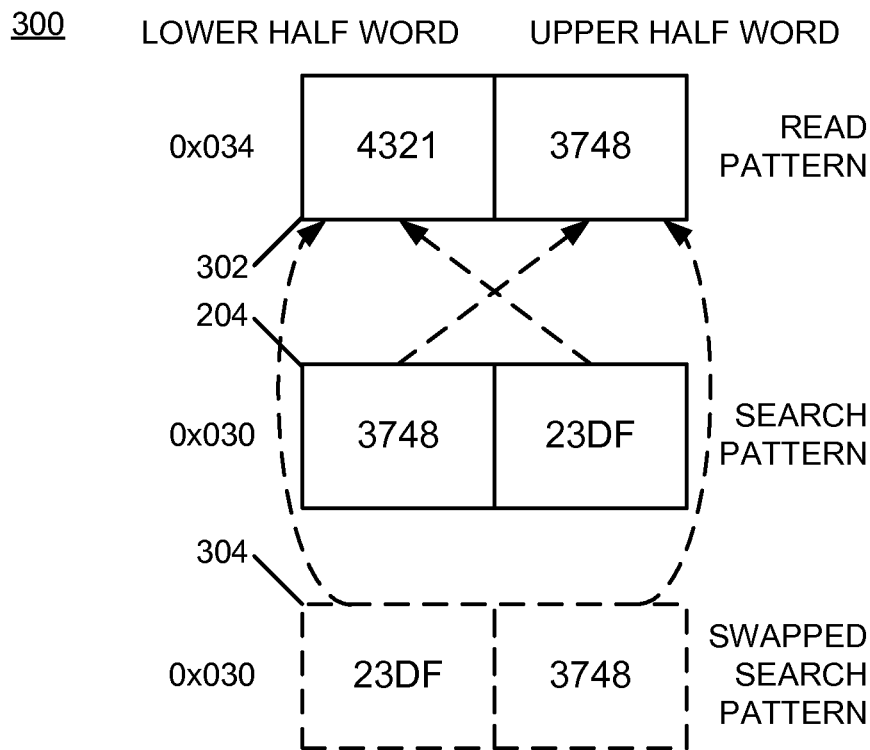
FIG. 3 is a diagram of an example of an implementation of a mapping that illustrates mapping of a displaced read operation against a search pattern for automated memory pattern searching via displaced-read memory addressing according to an embodiment of the present subject matter.

FIG. 3 is a diagram of an example of an implementation of a mapping 300 that illustrates mapping of a displaced read operation against a search pattern for automated memory pattern searching via displaced-read memory addressing. Within FIG. 3, the content of the displaced-read region 206 is shown captured as a read pattern 302 within a memory location at an address 0x034. The memory location at address 0x034 may, for example, include a register that forms a portion of the pattern search storage area 116. The read pattern 302 stores hexadecimal content "43213748." The read pattern is partitioned into two half words. The two half words are a lower half word read from the address 0x100 (hexadecimal "4321") and an upper half word read from the address 0x104 (hexadecimal "3748").

A comparison to identify a possible match of content at both addresses 0x100 and 0x104 may be performed by comparing each half of the search pattern 204 with the respective opposite half of the read pattern 302, as represented by the crossed dashed-line arrows within FIG. 3. It is additionally noted that a swapped search pattern 304 may be defined that allows a direct comparison of the respective half words, as represented by the arced dashed-line arrows within FIG. 3, without machine-level swap and/or shift instructions/logic that may be utilized to implement the comparison described above.

Regardless of the implementation of the search pattern, it may be seen that there is a match of the upper half word read from the address 0x104 with the hexadecimal content "3748." As described in more detail below, this potential match triggers one additional read operation of the full word width at address 0x104 and a full comparison with the search pattern. As can be seen from FIG. 3 in conjunction with FIG. 2, the full comparison of the search pattern 204 may be performed without any machine-level swap or shift instructions/logic, while the full comparison of the search pattern 304 may be performed by utilizing swap or shift instructions/logic to match the respective half words. As such, either implementation of the search pattern may be utilized either alone or in combination based upon the efficiency of swap, shift, and/or masking operations on the particular platform and the anticipated number of potential matches to be analyzed within a particular memory region of interest.

Figure 4A:
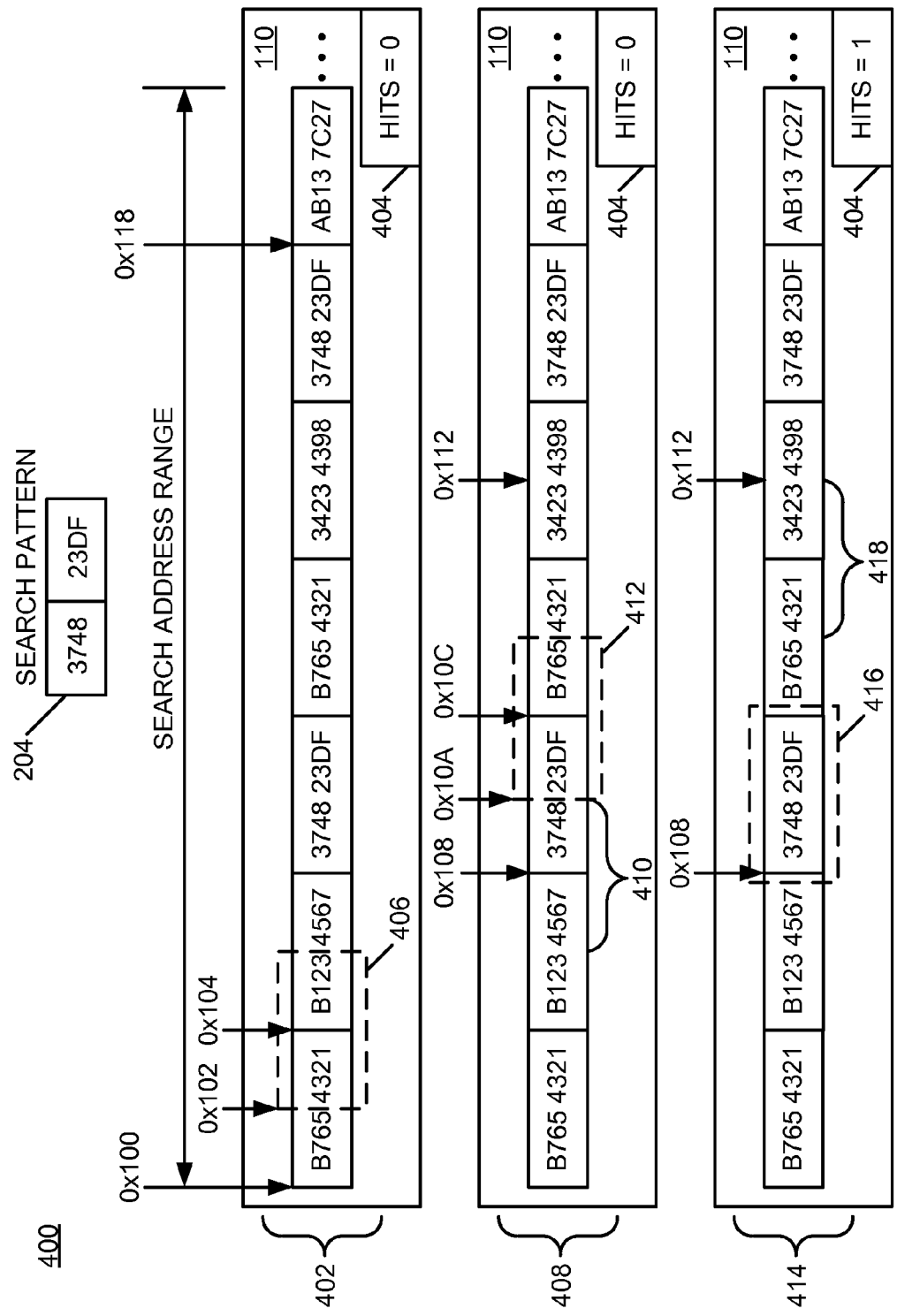
FIG. 4A is an illustration of a series of diagrams of an example of an implementation of a first portion of a displaced-read search that illustrates operation of displaced-read searching within a memory using a search pattern for automated memory pattern searching via displaced-read memory addressing according to an embodiment of the present subject matter.
Figure 4B:
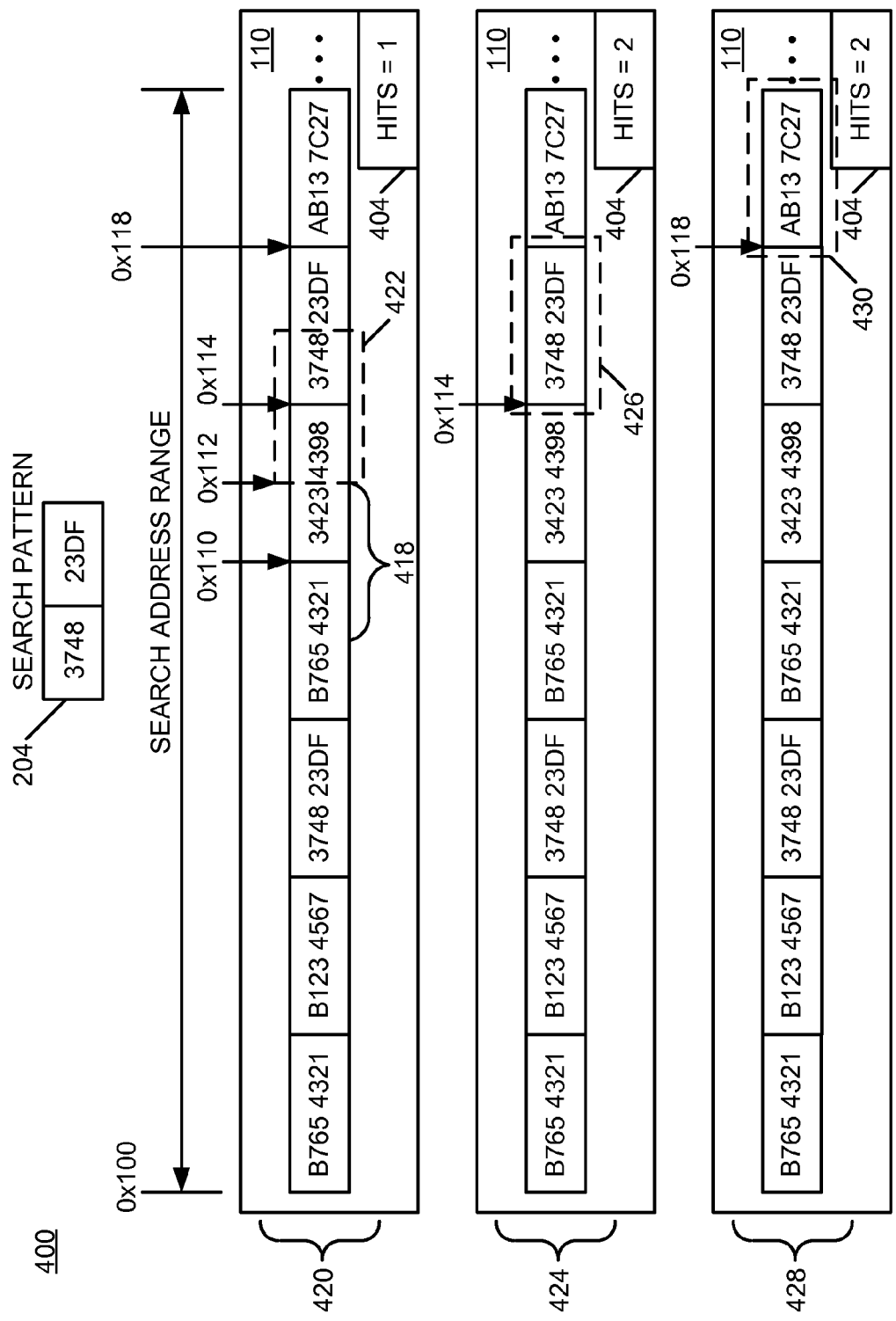
FIG. 4B is an illustration of a series of diagrams of an example of an implementation of an additional portion of a displaced-read search that illustrates operation of displaced-read searching within a memory using a search pattern for automated memory pattern searching via displaced-read memory addressing according to an embodiment of the present subject matter.

FIGS. 4A-4B illustrate a series of diagrams of an example of an implementation of a displaced-read search 400 that illustrates operation of displaced-read searching within a memory, such as the memory 110, using a search pattern for automated memory pattern searching via displaced-read memory addressing. It should be noted that the memory that is searched may include a core file stored within the core file storage area 114. The search pattern 204 of FIG. 2 is re-used within the present example and may be stored, for example, within the pattern search storage area 116 of the memory 110.

The series of diagrams within FIG. 4A-4B will be referred to by row designators for ease of identification. FIG. 4A shows initial processing for the displaced-read search 400. A row 402 represents a first phase of processing for the automated memory pattern searching via displaced-read memory addressing of the displaced read search 400. A hits counter 404 within the memory 110 identifies a number of successful identifications of the search pattern 204 within a memory search range identified to be from hexadecimal address 0x100 to hexadecimal address 0x118 (inclusive of the word-aligned data word stored at 0x118), as represented along the top of each of FIG. 4A and FIG. 4B. The hits counter 404 is initially set to zero (0).

The row 402 includes a series of data words separated at word-read boundaries by vertical solid lines. The first word boundary begins at hexadecimal 0x100. The second word boundary begins at hexadecimal 0x104. Subsequent word boundaries are at increments of four (4) hexadecimal address locations.

A displaced-read region 406 is illustrated to be initially located at a displaced-read address beginning with hexadecimal address 0x102. As such, the displaced-read region 406 is positioned to read a half word from each word of data stored at both the hexadecimal address 0x100 and the hexadecimal address 0x104. As with the other examples herein, Big Endian memory organization is assumed for purposes of the present example. As such, the displaced-read region 406 will read a lower half word of the word of data stored at hexadecimal address 0x100 and an upper half word of the word of data stored at hexadecimal address 0x104.

Using the technique described above, in association with FIG. 2 and FIG. 3, a word of data stored at hexadecimal address 0x102 is read from the memory 110 as defined by the displaced-read region 406. The word of data that is read from the memory 110 is compared with the search pattern 204 to determine whether a potential half word match exists within either word at the respective word boundary locations. As can be seen from the data represented within the displaced-read region 406, neither half word matches the respective half word of the search pattern. As such, there is no potential match of the full search pattern within either word at the word boundaries represented by the hexadecimal address 0x100 or the hexadecimal address 0x104. The displaced-read search 400 may then continue as described within a row 408. The row 408 shows, as described above, that in response to determining that no potential match has occurred with either word at the respective word boundaries as described in association with the row 402 above, the displaced-read search 400 jumps two (2) words to read data at the same respective lower and upper half words of two new data words located at two new word boundaries represented at hexadecimal address 0x108 and hexadecimal address 0x10C. As such, a region 410 of the memory 110 is not read for comparison purposes unless a subsequent match of the lower half word of the data word at hexadecimal address 0x108, which is at hexadecimal address 0x10A, is identified.

A displaced-read region 412 identifies a region of the memory 110 that is read during this second iteration of first level processing within the displaced-read search 400. The memory 110 is read at the half word offset represented by hexadecimal address 0x10A and a word of memory is captured from the memory 110. As described above, a lower half word of the word of data stored at hexadecimal address 0x108 and an upper half word stored at the hexadecimal address 0x10C are read.

As can be seen from FIG. 4A, the lower half word within the displaced-read region 412 that was read from the word of data at the word boundary at hexadecimal address 0x108 matches a lower half word of the search pattern 204. As such, a potential match for the search pattern 204 has been identified within the first level of processing of the displaced-read search 400. Processing for a first example of second-level processing for the displaced-read search 400 is shown and described in association with a row 414 below. However, for purposes of the present stage of processing for the displaced-read search 400, it is noted that the hits counter 404 is still set to zero (0) and indicates that a positive match of an entire word at a word boundary has not yet been identified.

Referring to the row 414, it can be seen that the displaced-read search 400 has adjusted read processing of the memory 110 and performs a read behind operation of the read address location of the word boundary at hexadecimal address 0x108, as represented by a non-displaced-read region 416. The non-displaced-read region 416 allows the displaced-read search 400 to read the entire word at the word boundary identified within the row 408 to have a potential match for the search pattern 204. The displaced-read search 400 reads the entire word of data stored at the hexadecimal address 0x108. As can be seen within the row 414, the data read from the memory 110 within the non-displaced-read region 416 is an identical match for the search pattern 204. As such, the hits counter 404 is incremented to a value of one (1) to identify that one match for the search pattern 204 has been identified within the memory 110. It is additionally noted that an address array or other memory structure may be stored within the memory 110 to store the address of this first match for the search pattern 204. This address array is not shown within FIG. 4A to avoid crowding within the drawing figure and to ease description of the present example. However, it is understood that it may be stored within the memory 110, more specifically, for example, within the pattern search storage area 116.

Prior to transitioning to the description of FIG. 4B, it should be noted that the displaced-read search 400 may resume processing of displaced reads relative to the last displaced read at hexadecimal address 0x10A. As such, the next displaced read may begin at hexadecimal address 0x112. This increment of the addressing allows a region 418 of the memory 110 to be skipped, which saves an entire read operation against the memory 110. By incrementing two word addresses from the last displaced-read operation, the displaced-read search 400 improves efficiency of searching within the memory 110 for the search pattern 204.

FIG. 4B shows additional processing for the displaced-read search 400. Referring to FIG. 4B, a row 420 illustrates again the skipped region 418 and shows a new displaced-read region 422 offset to a hexadecimal address 0x112. As can be seen within the displaced-read region 422, a potential match for the search pattern 204 has been identified within the upper half word of the word stored at the word boundary represented by hexadecimal address 0x114. In response to identifying this potential match at the hexadecimal address 0x114, the displaced-read search 400 performs a read ahead operation as depicted within the row 424. A non-displaced-read region 426 identifies a word boundary read operation performed at hexadecimal address 0x114. As can be seen within the non-displaced-read region 426, an exact match for the search pattern 204 is identified by the displaced-read search 400. In response to processing to determine that an identical match to the search pattern 204 has been identified, the hits counter 404 is incremented to two (2), which represents that two identical matches for the search pattern 204 have been identified within the memory 110. As described above in association with FIG. 4A, and address array may also be stored within the memory 110 to store the hexadecimal address 0x114 at which the second identical match for the search pattern 204 is located.

A row 428 shows processing associated with an end of the search address range. As can be seen within the row 428, the end of the search address range will be passed if a double word jump to perform an additional displaced read of the memory 110 is performed. As such, the displaced-read search 400 word-aligns the last read operation by defining a non-displaced-read region 430 and reading the final word of data within the search address range that ends at hexadecimal address 0x118 (inclusive of the word-aligned data word stored at 0x118). As can be seen within the non-displaced-read region 430, there is not an identical match for the search pattern 204. As such, the hits counter 404 is not incremented and the displaced-read search 400 ends at the end of the search address range that has been defined. It should be noted that the search address range may be defined to align with the end of the memory 110 or otherwise as appropriate for the given implementation.

It should be noted that the present example data set illustrates single matches associated with consecutive word-aligned boundaries within the memory 110. However, it is also possible that consecutive data words may both match the search pattern. In such a situation, where the displaced-read search 400 determines that there is a potential match in each portion of the respective displaced-read region, each portion may be processed as described above. The displaced-read search 400 may perform both a read behind and a read ahead at the respective word-aligned addresses to determine whether there are full word-aligned data word matches with the search pattern at both word-aligned addresses that are the subject of the displaced-read operation. As such, two consecutive full word matches may also be identified.

As such, the displaced-read search 400 iteratively performs a first level of read operations at displaced addresses and jumps two words for each subsequent displaced-read operation. For memory data content without any search pattern matches, half of the read operations that would be required by linear search processing may be performed to determine that there are no matches for the respective search pattern, with the exception of a final read operation in the case of an odd number of words within the respective search address range. In response to identification of a potential match within either data word that is partially read within a displaced-read region, the displaced-read search 400 either reads behind the displaced-read address to align at a prior word boundary within the memory 110, or reads ahead of the displaced-read address to align at a subsequent word boundary, aligning a half word behind or ahead, respectively, of the displaced-read region. The word of data that is read from the word-aligned boundary is then compared to the respective search pattern 204, and matches for the search pattern 204 are accumulated, along with address locations of the respective matches for the search pattern 204.

Figure 5:
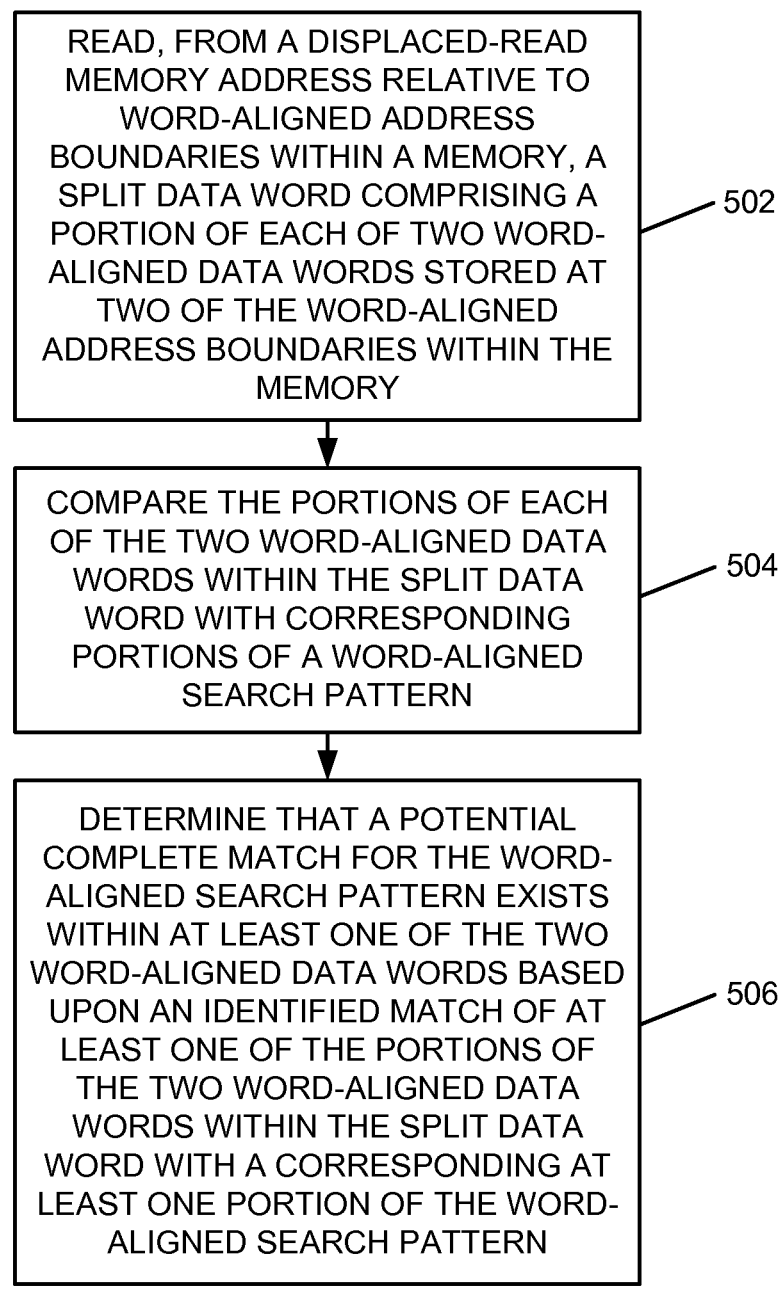
FIG. 5 is a flow chart of an example of an implementation of a process for automated memory pattern searching via displaced-read memory addressing according to an embodiment of the present subject matter.
Figure 6A:
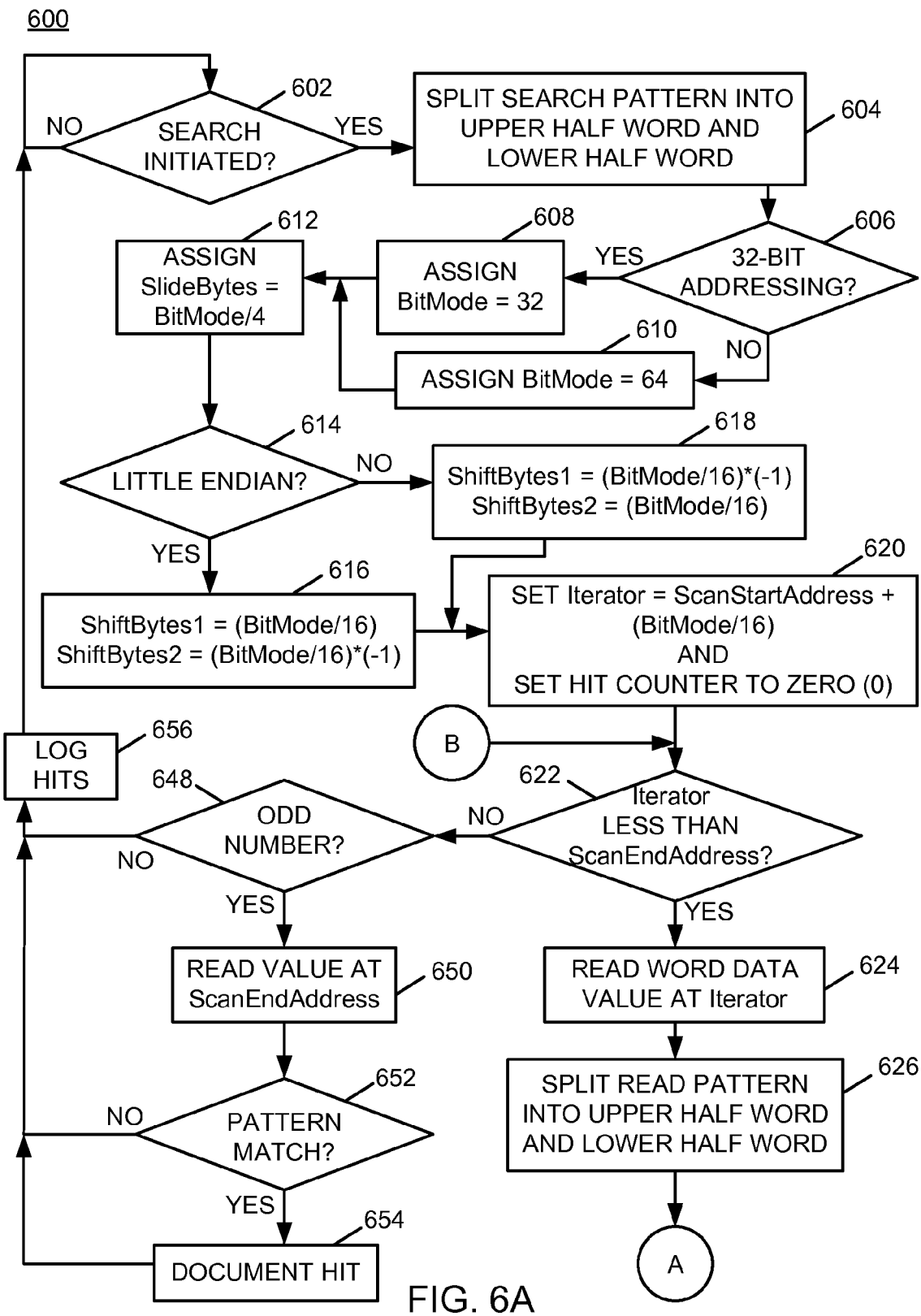
FIG. 6A is a flow chart of an example of an implementation of initial processing within a process for automated memory pattern searching via displaced-read memory addressing according to an embodiment of the present subject matter.
Figure 6B:
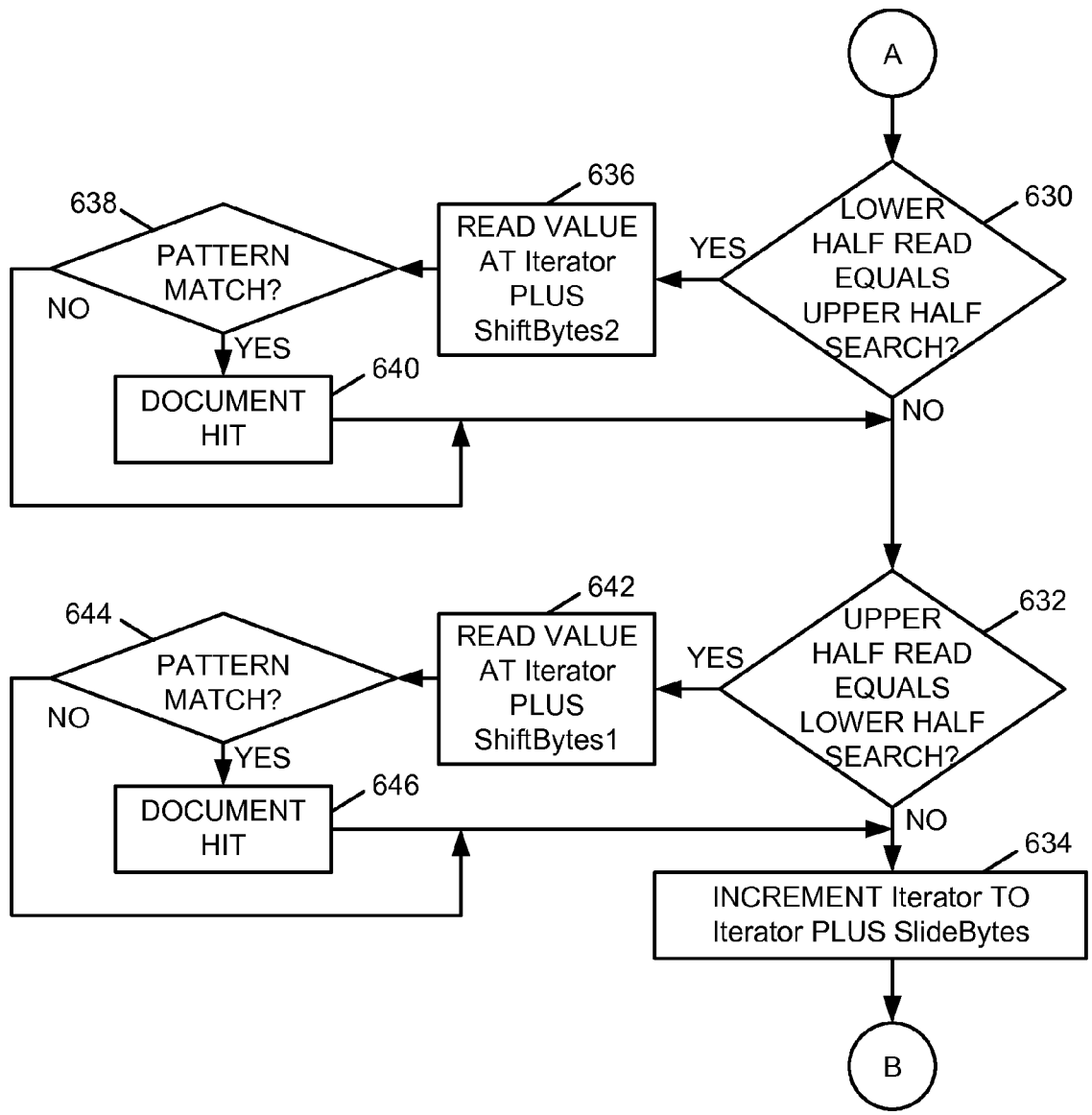
FIG. 6B is a flow chart of an example of an implementation of additional processing within a process for automated memory pattern searching via displaced-read memory addressing according to an embodiment of the present subject matter.

FIG. 5 through FIG. 6B described below represent example processes that may be executed by devices, such as the computing device 100, to perform the automated memory pattern searching via displaced-read memory addressing associated with the present subject matter. Many other variations on the example processes are possible and all are considered within the scope of the present subject matter. The example processes may be performed by modules, such as the pattern search processing module 118 and/or executed by the CPU 102, associated with such devices. It should be noted that time out procedures and other error control procedures are not illustrated within the example processes described below for ease of illustration purposes. However, it is understood that all such procedures are considered to be within the scope of the present subject matter. Further, the described processes may be combined, sequences of the processing described may be changed, and additional processing may be added without departure from the scope of the present subject matter.

FIG. 5 is a flow chart of an example of an implementation of a process 500 for automated memory pattern searching via displaced-read memory addressing. At block 502, the process 500 reads, from a displaced-read memory address relative to word-aligned address boundaries within a memory, a split data word comprising a portion of each of two word-aligned data words stored at two of the word-aligned address boundaries within the memory. At block 504, the process 500 compares the portions of each of the two word-aligned data words within the split data word with corresponding portions of a word-aligned search pattern. At block 506, the process 500 determines that a potential complete match for the word-aligned search pattern exists within at least one of the two word-aligned data words based upon an identified match of at least one of the portions of the two word-aligned data words within the split data word with a corresponding at least one portion of the word-aligned search pattern.

FIGS. 6A-6B illustrate a flow chart of an example of an implementation of process 600 for automated memory pattern searching via displaced-read memory addressing. The processing described in association with the process 600 utilizes thirty-two bit (32-bit) or sixty-four bit (64-bit) addressing options for purposes of example. However, it is understood that the present subject matter may be applied to address bus widths of any size (e.g., smaller address bus widths such as 8-bit and 16-bit, or larger bus widths as they become available within the marketplace, such as 128-bit, etc.) with appropriate modifications for the variable settings and calculations described below. It is understood that a person of skill would be able to make the modifications for different address bus widths based upon the description below. FIG. 6A illustrates initial processing within the process 600. At decision point 602, the process 600 makes a determination as to whether an initiation of a displaced-read memory search has been detected. Initiation of a displaced-read memory search may be detected, for example, in response to receipt of a request to initiate a displaced-read memory search at the pattern search processing module 118. A request to initiate a displaced-read memory search is also assumed to include a search pattern for purposes of the present example. However, a search pattern may alternatively be pre-defined and stored within a memory, such as the memory 110. It is further understood that the processing described in association with the present example operates on memory associated with the core file storage area 114 of the memory 110.

In response to determining that initiation of a displaced-read memory search request has been detected at decision point 602, the process 600 splits/divides the received search pattern into an upper half word and a lower half word at block 604. As such, the present example utilizes half word comparisons of data read from two consecutive word-aligned memory addresses via displaced-reads of memory addresses. However, it is understood that a search pattern may be divided differently as appropriate for the given implementation.

At decision point 606, the process 600 makes a determination as to whether the memory addressing is organized as thirty-two bit (32-bit) or sixty-four bit (64-bit) addressing. In response to determining that the memory addressing is organized as 32-bit addressing, the process 600 assigns a variable named "BitMode" the value thirty-two (32) at block 608. In response to determining that the memory addressing is organized as 64-bit addressing, the process 600 assigns a variable named "BitMode" the value sixty-four (64) at block 610. In response to one of the respective assignments at blocks 608 or 610, the process 600 assigns a variable named "SlideBytes" a value of the assigned BitMode variable divided by four (Bit-Mode/4) at block 612. The SlideBytes variable identifies how many bytes to slide the addressing to locate the next displaced-read address as described above and in more detail below.

At decision point 614, the process 600 makes a determination as to whether the memory is organized as Little Endian or Big Endian. In response to determining at decision point 614 that the memory organization is Little Endian, the process 600 assigns two variables that are used for processing the iterations of the displaced-read processing at block 616. The variable assignments for this determination are an assignment of a variable called "ShiftBytes1" to equal the identified BitMode divided by sixteen (ShiftBytes1=(BitMode/16)) and an assignment of a variable called "ShiftBytes2" to equal the identified BitMode divided by sixteen multiplied by negative one (ShiftBytes2=(BitMode/16)*(−1)). In response to determining at decision point 614 that the memory is organized as Big Endian, the process 600 assigns the variables "ShiftBytes1" and "ShiftBytes2" at block 618 to values opposite to the assignments described above at block 616 (e.g., ShiftBytes1=(BitMode/16)*(−1) and ShiftBytes2=(Bit-Mode/16)).

At block 620, the process 600 begins the iteration of the automated memory pattern searching via displaced-read memory addressing by setting an "Iterator" variable equal to the start of scan address ("ScanStartAddress") plus the identified BitMode divided by sixteen (Iterator=ScanStartAddress+(BitMode/16)). This operation locates the read address for the displaced-read of memory halfway between the word-aligned read boundary of two data words within the memory. The process 600 also sets a variable/counter called "Hits" to zero (0) at block 620. The Hits variable/counter is used to store the number of identified exact matches for the search pattern identified by the process 600. The Hits variable in conjunction with documentation of the address locations of any complete matches are provided as output of the process 600, as described in more detail below.

At decision point 622, the process 600 makes a determination as to whether the Iterator variable is still less than an end of scan address ("ScanEndAddress"). In response to determining that the Iterator variable is less than the end of scan address, the process 600 begins processing read values from the memory by reading a word-width data value from the displaced-read memory address relative to word-aligned address boundaries within the memory at block 624. As such, the process 600 reads a split data word comprising a portion of each of two word-aligned data words stored at two of the word-aligned address boundaries within the memory from a displaced-read memory address relative to word-aligned address boundaries within a memory. Processing to read a data word from the displaced-read address may be considered a first level of a two-level memory search that operates to identify potential matches of complete data words at word boundaries.

It is understood that for purposes of the present example the data value is binary or hexadecimal encoded data and that bitwise comparison may be performed to determine matches. Further, the word-width data word value that is read from the memory represents a split data word that includes a portion of each of two word-aligned data words stored at two of the word-aligned address boundaries within the memory. For purposes of the present examples, the split data word includes a half of each data word at the respective word-aligned boundaries, an upper half of one data word and a lower half of the other data word. The organization of the respective upper and lower halves varies depending upon the encoding of the memory for Big Endian or Little Endian encoding. At block 626, the process 600 splits the read pattern obtained from the memory into an upper half word and a lower half word. As described above, the process 600 may cross-compare lower half words of the split data word with upper half words of the word-aligned search pattern and cross-compare upper half words of the split data word with lower half words of the word-aligned search pattern. Alternatively, the process may swap the halves of the word-aligned search pattern to allow direct comparison of the respective half words without machine-level swap or shift instructions/logic for each comparison within the first-level processing of the two-level memory search described herein. The process 600 transitions to the processing shown and described in association with FIG. 6B.

FIG. 6B illustrates additional processing associated with the process 600 for automated memory pattern searching via displaced-read memory addressing and details a second-level of the two-level memory search. At decision point 630, the process 600 begins comparing half words of the search pattern with the split data word by determining whether the lower half word of the split data value read from the memory equals the upper half word of the search pattern. In response to determining that the lower half word of the split data word read from the memory does not equal the upper half word of the search pattern, the process 600 makes a determination at decision point 632 as to whether the upper half word of the split data word read from the memory equals the lower half word of the search pattern.

As such, the process 600 compares the portions of each of the two word-aligned data words within the split data word with corresponding portions of a word-aligned search pattern and determines whether a potential complete match for the word-aligned search pattern exists within at least one of the two word-aligned data words based upon an identified match of at least one of the portions of the two word-aligned data words within the split data word with a corresponding at least one portion of the word-aligned search pattern. In response to determining that the upper half word of the split data word read from the memory does not equal the lower half word of the search pattern at decision point 632, the process 600 increments the Iterator variable to add the number of bytes represented within the SlideBytes variable (e.g., Iterator=Iterator+SlideBytes) at block 634. This increment operation provides the appropriate increment of the read location based upon the current address width to the next displaced-read memory location based upon the memory representation (e.g., 32 bits, 64 bits, etc.). For purposes of the present example, this increment operations results in an increment of the displaced-read memory address of the first level of the two-level memory search by two data word addresses for each iteration of the first level of the two-level memory search.

The process 600 then returns to the processing described in association with FIG. 6A at decision point 622 and iterates as described above for the next iteration of memory reading at the new displaced-read address if the Iterator variable is still less than the end of scan address. Additional processing for a negative determination at decision point 622 will be described further below in favor of returning to complete the description of FIG. 6B. As such, for purposes of the present portion of the description, it is assumed that at least one additional determination is made at decision point 622 that the Iterator variable is still less than an end of scan address and that processing continues as described above to decision point 630 in FIG. 6B.

Returning to FIG. 6B and the processing described in association with decision point 630, in response to determining that the lower half word of the split data word read from the memory equals the upper half word of the search pattern (i.e., that a potential complete match for the word-aligned search pattern exists within one of the two word-aligned data words represented by the split data word), the process 600 reads a word-width data value from a memory address at the Iterator variable plus the "ShiftBytes2" variable (Iterator+Shift-Bytes2) at block 636. As noted above, the ShiftBytes2 variable is set based upon the memory encoding of Big Endian versus Little Endian. As such, the ShiftBytes2 variable may be either positive or negative and the addition of the Shift-Bytes2 variable to the Iterator variable may result in an address for the word-aligned read operation that is lower or greater than the Iterator variable that represents the current displaced-read memory location. As such, the process 600 reads, in response to determining that the potential complete match for the word-aligned search pattern exists within at least one of the two word-aligned data words, one complete data word from the word-aligned address boundary at which the at least one of the two word-aligned data words is stored within the memory. Further, reading the complete data word may involve decrementing or incrementing the respective displaced-read memory address to a word-aligned address boundary below or above, respectively, the current displaced-read memory address based upon the setting of the Shift-Bytes2 variable. Additionally, the read of the complete data word may be considered a second level of the two-level memory search iteratively performed in response to each determined potential complete match for the word-aligned search pattern identified via the first level of the two-level memory search.

At decision point 638, the process 600 compares the one complete data word read from the memory with the word-aligned search pattern and makes a determination as to whether there is a complete data word match for the word-aligned search pattern within the one of the two word-aligned data words associated with the split data word. In response to determining that there is a complete data word match for the word-aligned search pattern at the word-aligned memory address, the process 600 documents the complete match by incrementing the Hit variable and storing the address of the complete match within the memory at block 640. In response to either documenting the complete match at block 640 or in response to determining that there is not a complete data word match for the word-aligned search pattern at decision point 638, the process 600 returns to decision point 632 and iterates as described above.

Returning to the description of decision point 632, in response to determining that the upper half word of the split data word read from the memory equals the lower half word of the search pattern (i.e., that a potential complete match for the word-aligned search pattern exists within the other one of the two word-aligned data words represented by the split data word), the process 600 reads a word-width data value from a memory address at the Iterator variable plus the "Shift-Bytes1" variable (Iterator+ShiftBytes1) at block 642. As noted above, the ShiftBytes1 variable is set based upon the memory encoding of Big Endian versus Little Endian and is opposite to the value of the ShiftBytes2 variable. As such, the ShiftBytes1 variable may be either positive or negative and the addition of the ShiftBytes1 variable to the Iterator variable may result in an address for the word-aligned read operation that is lower or greater than the Iterator variable that represents the current displaced-read memory location (e.g., opposite to the direction of the processing described in association with the processing at block 636). As such, the process 600 reads, in response to determining that the potential complete match for the word-aligned search pattern exists within the other one of the two word-aligned data words associated with the split data word, one complete data word from the word-aligned address boundary at which other one of the two word-aligned data words is stored within the memory. Further, reading the complete data word may involve decrementing or incrementing the respective displaced-read memory address to a word-aligned address boundary below or above, respectively, the current displaced-read memory address based upon the setting of the ShiftBytes1 variable. Additionally, as described above, the read of the complete data word may be considered a second level of the two-level memory search iteratively performed in response to each determined potential complete match for the word-aligned search pattern identified via the first level of the two-level memory search.

At decision point 644, the process 600 compares the other one complete data word read from the memory with the word-aligned search pattern and makes a determination as to whether there is a complete data word match for the word-aligned search pattern within the other one of the two word-aligned data words associated with the split data word. In response to determining that there is a complete data word match for the word-aligned search pattern at the word-aligned memory address, the process 600 documents the complete match by incrementing the Hit variable and storing the address of the complete match within the memory at block 646. In response to either documenting the complete match at block 646 or in response to determining that there is not a complete data word match for the word-aligned search pattern at decision point 644, the process 600 returns to block 634 and iterates as described above.

Returning to the description of FIG. 6A and the processing associated with decision point 622, the process 600 iterates the processing of the first level of the two-level memory search through the memory until there is a determination that the Iterator variable is no longer less than the end of scan address. In response to determining that the Iterator variable is no longer less than the end of scan address, the process 600 makes a determination at decision point 648 as to whether there are an odd number of data words within the present memory search address range. The processing to determine whether there are an odd number of data words within the present memory search address range may be performed by processing such as performing a calculation to determine whether a quantity represented by the variable ScanEndAddress minus the variable ScanStartAddress plus the variable BitMode divided by eight (8) has a remainder when divided by the variable SlideBytes (e.g., such as via the equation (ScanEndAddress−ScanStartAddress+(BitMode)/8) % SlideBytes!=0). It is understood that the equality operator exclamation point followed by the equals sign (e.g., "!=) is a "not equal to" equality operator and that the result of the expression described above being not equal to zero (0) means that there is an odd number of data words within the present memory search address range. As such, the process 600 may determine whether an odd number of word-aligned data words within the specified memory search address range results in a single word-aligned data word at the end of the specified memory search address range that has not been processed.

In response to determining that there are an odd number of data words within the present memory search address range, the process 600 reads a complete data word from a word-aligned memory address at which the single word-aligned data word is stored within the memory referenced by the variable ScanEndAddress at block 650. At decision point 652, the process 600 compares the complete data word with the word-aligned search pattern and makes a determination as to whether there a complete data word match for the word-aligned search pattern that exists within the single word-aligned data word based upon the comparison. In response to determining that there is a complete data word match, the process 600 documents the complete match by incrementing the Hit variable and storing the address of the complete match within the memory at block 654.

In response to either determining that there is not an odd number of data words within the present memory search range at decision point 648, in response to determining that there is not a complete data word match for the word-aligned search pattern at decision point 652, or in response to documenting the complete match at block 654, the process 600 logs all positive determinations of complete data word matches represented at block 656. Logging all positive determinations of complete data word matches may include generating a report, message, email, or other indicia that documents the number of complete matches represented within the Hits variable and the respective address locations of the complete matches within the memory search range of the memory. The process 600 returns to decision point 602 and iterates as described above.

As such, the process 600 provides a two-level memory search that iteratively reads from displaced-read memory addresses within a memory to capture a split data word that includes a portion of each of two word-aligned data words stored at two word-aligned address boundaries within the memory. By processing a portion of two data words during each iteration of the first level processing of a two-level memory search, the process 600 may reduce read operations for situations where there is no potential match for either word-aligned data word by fifty percent (50%). For situations where there is a potential of a match identified within either portion of a word-aligned data word, an additional read operation and comparison are performed within a second level of the two-level memory search to determine whether there is a complete data word match at the respective word-aligned memory locations. As such, improved memory searching may be provided by the process 600. The process 600 logs addresses and increments a search match counter for each positive complete word data match.

As described above in association with FIG. 1 through FIG. 6B, the example systems and processes provide memory pattern searching via displaced-read memory addressing. Many other variations and additional activities associated with memory pattern searching via displaced-read memory addressing are possible and all are considered within the scope of the present subject matter.

Those skilled in the art will recognize, upon consideration of the above teachings, that certain of the above examples are based upon use of a programmed processor, such as the CPU 102. However, the invention is not limited to such example embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable storage medium that can direct a computer or other programmable data processing apparatus to function in a particular manner, such that the instructions stored in the computer-readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
reading, via a processor from a displaced-read memory offset address adjusted relative to word-aligned memory operations of a memory access system that utilizes word-aligned address boundaries within a memory, a split data word from the memory comprising a portion of each of two word-aligned data words stored by the memory access system within the memory using the word-aligned memory operations at two of the word-aligned address boundaries within the memory, where reading the split data word from the displaced-read memory offset address comprises a first level of a two-level memory search;
comparing the portions of each of the two word-aligned data words within the split data word with corresponding portions of a word-aligned search pattern;
determining that a potential complete match for the word-aligned search pattern exists within at least one of the two word-aligned data words based upon an identified match of at least one of the portions of the two word-aligned data words within the split data word with a corresponding at least one portion of the word-aligned search pattern;
iterating processing of the first level of the two-level memory search through the memory;
performing a second level of the two-level memory search in response to each determined potential complete match for the word-aligned search pattern, comprising:
reading, in response to determining that the potential complete match for the word-aligned search pattern exists within the at least one of the two word-aligned data words, at least one complete data word from a word-aligned address boundary at which the at least one of the two word-aligned data words is stored within the memory, where reading the at least one complete data word from the word-aligned address boundary at which the at least one of the two word-aligned data words is stored within the memory comprises the second level of the two-level memory search of the two word-aligned data words:
comparing the at least one complete data word with the word-aligned search pattern; and
determining whether a complete data word match for the word-aligned search pattern exists within the at least one of the two word-aligned data words based upon the comparison of the at least one complete data word with the word-aligned search pattern;
where the two-level memory search comprises a specified memory search address range, and further comprising:
determining whether an odd number of word-aligned data words within the specified memory search address range results in a single word-aligned data word at an end of the specified memory search address range that has not been processed;
reading, in response to determining that the odd number of word-aligned data words within the specified memory search address range results in the single word-aligned data word at the end of the specified memory search address range that has not been processed, a complete data word from a word-aligned address at which the single word-aligned data word is stored within the memory;
comparing the complete data word with the word-aligned search pattern; and
determining whether the complete data word match for the word-aligned search pattern exists within the single word-aligned data word based upon the comparison of the complete data word with the word-aligned search pattern.

2. The method of claim 1, further comprising logging all positive determinations of complete data word matches.

3. The method of claim 1, where reading, in response to determining that the potential complete match for the word-aligned search pattern exists within the at least one of the two word-aligned data words, the at least one complete data word from the word-aligned address boundary at which the at least one of the two word-aligned data words is stored within the memory comprises:
decrementing the displaced-read memory offset address to a word-aligned address at a word-aligned address boundary of the memory access system below the displaced-read memory offset address in response to determining that a lower-addressed data word of the two word-aligned data words comprises the potential complete match for the word-aligned search pattern; and incrementing the displaced-read memory offset address to a word-aligned address at a word-aligned address boundary of the memory access system above the displaced-read memory offset address in response to determining that a higher-addressed data word of the two word-aligned data words comprises the potential complete match for the word-aligned search pattern.

4. The method of claim 1, where iterating the processing of the first level of the two-level memory search through the memory comprises incrementing the displaced-read memory offset address of the first level of the two-level memory search by two data word addresses for each iteration of the first level of the two-level memory search.

5. The method of claim 1, where the portion of each of the two word-aligned data words stored by the memory access system within the memory using the word-aligned memory operations at the two of the word-aligned address boundaries within the memory comprise a half word of each of the two word-aligned data words, and where comparing the portions of each of the two word-aligned data words within the split data word with the corresponding portions of the word-aligned search pattern comprises:

cross-comparing a lower half word of the split data word with an upper half word of the word-aligned search pattern and cross-comparing an upper half word of the split data word with a lower half word of the word-aligned search pattern.

6. A system, comprising:
a memory; and
a processor programmed to:
read, from a displaced-read memory offset address adjusted relative to word-aligned memory operations of a memory access system that utilizes word-aligned address boundaries within the memory, a split data word from the memory comprising a portion of each of two word-aligned data words stored by the memory access system within the memory using the word-aligned memory operations at two of the word-aligned address boundaries within the memory, where the programming for reading the split data word from the displaced-read memory offset address comprises a first level of a two-level memory search;

compare the portions of each of the two word-aligned data words within the split data word with corresponding portions of a word-aligned search pattern;

determine that a potential complete match for the word-aligned search pattern exists within at least one of the two word-aligned data words based upon an identified match of at least one of the portions of the two word-aligned data words within the split data word with a corresponding at least one portion of the word-aligned search pattern;

iterate processing of the first level of the two-level memory search through the memory;

perform a second level of the two-level memory search in response to each determined potential complete match for the word-aligned search pattern, comprising being programmed to:

read, in response to determining that the potential complete match for the word-aligned search pattern exists within the at least one of the two word-aligned data words, at least one complete data word from a word-aligned address boundary at which the at least one of the two word-aligned data words is stored within the memory, where the programming for reading the at least one complete data word from the word-aligned address boundary at which the at least one of the two word-aligned data words is stored within the memory comprises the second level of the two-level memory search of the two word-aligned data words;

compare the at least one complete data word with the word-aligned search pattern; and determine whether a complete data word match for the word-aligned search pattern exists within the at least one of the two word-aligned data words based upon the comparison of the at least one complete data word with the word-aligned search pattern;

where the two-level memory search comprises a specified memory search address range, and where the processor is further programmed to:

determine whether an odd number of word-aligned data words within the specified memory search address range results in a single word-aligned data word at an end of the specified memory search address range that has not been processed;

read, in response to determining that the odd number of word-aligned data words within the specified memory search address range results in the single word-aligned data word at the end of the specified memory search address range that has not been processed, a complete data word from a word-aligned address at which the single word-aligned data word is stored within the memory;

compare the complete data word with the word-aligned search pattern; and determine whether the complete data word match for the word-aligned search pattern exists within the single word-aligned data word based upon the comparison of the complete data word with the word-aligned search pattern.

7. The system of claim 6, where the processor is further programmed to log all positive determinations of complete data word matches.

8. The system of claim 6, where, in being programmed to read, in response to determining that the potential complete match for the word-aligned search pattern exists within the at least one of the two word-aligned data words, the at least one complete data word from the word-aligned address boundary at which the at least one of the two word-aligned data words is stored within the memory, the processor is programmed to:

decrement the displaced-read memory offset address to a word-aligned address at a word-aligned address boundary of the memory access system below the displaced-read memory offset address in response to determining that a lower-addressed data word of the two word-aligned data words comprises the potential complete match for the word-aligned search pattern; and increment the displaced-read memory offset address to a word-aligned address at a word-aligned address boundary of the memory access system above the displaced-read memory offset address in response to determining that a higher-addressed data word of the two word-aligned data words comprises the potential complete match for the word-aligned search pattern.

9. The system of claim 6, where, in being programmed to iterate the processing of the first level of the two-level memory search through the memory, the processor is programmed to increment the displaced-read memory offset address of the first level of the two-level memory search by two data word addresses for each iteration of the first level of the two-level memory search.

10. The system of claim 6, where the portion of each of the two word-aligned data words stored by the memory access system within the memory using the word-aligned memory operations at the two of the word-aligned address boundaries within the memory comprise a half word of each of the two word-aligned data words, and where, in being programmed to compare the portions of each of the two word-aligned data words within the split data word with the corresponding portions of the word-aligned search pattern, the processor is programmed to:

cross-compare a lower half word of the split data word with an upper half word of the word-aligned search pattern and cross-compare an upper half word of the split data word with a lower half word of the word-aligned search pattern.

11. A computer program product comprising a computer readable storage device including computer readable program code, where the computer readable program code when executed on a computer causes the computer to:

read, from a displaced-read memory offset address adjusted relative to word-aligned memory operations of a memory access system that utilizes word-aligned address boundaries within a memory, a split data word from the memory comprising a portion of each of two word-aligned data words stored by the memory access system within the memory using the word-aligned memory operations at two of the word-aligned address boundaries within the memory, where the computer readable program code for reading the split data word from the displaced-read memory offset address comprises a first level of a two-level memory search;

compare the portions of each of the two word-aligned data words within the split data word with corresponding portions of a word-aligned search pattern;

determine that a potential complete match for the word-aligned search pattern exists within at least one of the two word-aligned data words based upon an identified match of at least one of the portions of the two word-aligned data words within the split data word with a corresponding at least one portion of the word-aligned search pattern;

iterate processing of the first level of the two-level memory search through the memory;

perform a second level of the two-level memory search in response to each determined potential complete match for the word-aligned search pattern, comprising computer readable program code that when executed on the computer causes the computer to:

read, in response to determining that the potential complete match for the word-aligned search pattern exists within the at least one of the two word-aligned data words, at least one complete data word from a word-aligned address boundary at which the at least one of the two word-aligned data words is stored within the memory, where the computer readable program code for reading the at least one complete data word from the word-aligned address boundary at which the at least one of the two word-aligned data words is stored within the memory comprises the second level of the two-level memory search of the two word-aligned data words;

compare the at least one complete data word with the word-aligned search pattern; and determine whether a complete data word match for the word-aligned search pattern exists within the at least one of the two word-aligned data words based upon the comparison of the at least one complete data word with the word-aligned search pattern;

where the two-level memory search comprises a specified memory search address range, and where the computer readable program code when executed on the computer further causes the computer to:

determine whether an odd number of word-aligned data words within the specified memory search address range results in a single word-aligned data word at an end of the specified memory search address range that has not been processed;

read, in response to determining that the odd number of word-aligned data words within the specified memory search address range results in the single word-aligned data word at the end of the specified memory search address range that has not been processed, a complete data word from a word-aligned address at which the single word-aligned data word is stored within the memory;

compare the complete data word with the word-aligned search pattern; and determine whether the complete data word match for the word-aligned search pattern exists within the single word-aligned data word based upon the comparison of the complete data word with the word-aligned search pattern.

12. The computer program product of claim 11, where the computer readable program code when executed on the computer further causes the computer to log all positive determinations of complete data word matches.

13. The computer program product of claim 11, where, in causing the computer to read, in response to determining that the potential complete match for the word-aligned search pattern exists within the at least one of the two word-aligned data words, the at least one complete data word from the word-aligned address boundary at which the at least one of the two word-aligned data words is stored within the memory, the computer readable program code when executed on the computer causes the computer to:

decrement the displaced-read memory offset address to a word-aligned address at a word-aligned address boundary of the memory access system below the displaced-read memory offset address in response to determining that a lower-addressed data word of the two word-aligned data words comprises the potential complete match for the word-aligned search pattern; and increment the displaced-read memory offset address to a word-aligned address at a word-aligned address boundary of the memory access system above the displaced-read memory offset address in response to determining that a higher-addressed data word of the two word-aligned data words comprises the potential complete match for the word-aligned search pattern.

14. The computer program product of claim 11, where, in causing the computer to iterate the processing of the first level of the two-level memory search through the memory, the computer readable program code when executed on the computer causes the computer to increment the displaced-read memory offset address of the first level of the two-level memory search by two data word addresses for each iteration of the first level of the two-level memory search.

15. The computer program product of claim 11, where the portion of each of the two word-aligned data words stored by the memory access system within the memory using the word-aligned memory operations at the two of the word-aligned address boundaries within the memory comprise a half word of each of the two word-aligned data words, and where, in causing the computer to compare the portions of each of the two word-aligned data words within the split data word with the corresponding portions of the word-aligned search pattern, the computer readable program code when executed on the computer causes the computer to:
 cross-compare a lower half word of the split data word with an upper half word of the word-aligned search pattern and cross-compare an upper half word of the split data word with a lower half word of the word-aligned search pattern.

* * * * *